United States Patent
Larabell

(10) Patent No.: US 8,099,698 B2
(45) Date of Patent: Jan. 17, 2012

(54) VERIFICATION TEST FAILURE ANALYSIS

(75) Inventor: Joseph Leroy Larabell, Tokyo (JP)

(73) Assignee: Mentor Graphics Corporation, Wilsonville, OR (US)

( * ) Notice: Subject to any disclaimer, the term of this patent is extended or adjusted under 35 U.S.C. 154(b) by 143 days.

(21) Appl. No.: 12/362,672

(22) Filed: Jan. 30, 2009

(65) Prior Publication Data

US 2010/0199242 A1  Aug. 5, 2010

(51) Int. Cl.
*G06F 17/50* (2006.01)

(52) U.S. Cl. .................................................. 716/110

(58) Field of Classification Search .............. 716/1, 5, 716/110
See application file for complete search history.

(56) References Cited

U.S. PATENT DOCUMENTS

| | | | |
|---|---|---|---|
| 6,918,099 B2* | 7/2005 | Subbarayan | 716/106 |
| 7,360,138 B2* | 4/2008 | Craig et al. | 714/741 |
| 2004/0163059 A1* | 8/2004 | Subbarayan | 716/5 |
| 2007/0168727 A1* | 7/2007 | Fournier et al. | 714/25 |
| 2007/0220386 A1* | 9/2007 | Craig et al. | 714/728 |
| 2008/0295043 A1* | 11/2008 | Chang et al. | 716/3 |
| 2009/0192963 A1* | 7/2009 | Sankaranarayanan et al. | 706/46 |
| 2010/0102825 A1* | 4/2010 | Bushnell et al. | 324/537 |

* cited by examiner

*Primary Examiner* — Suchin Parihar

(74) *Attorney, Agent, or Firm* — Richard A. Dyer

(57) ABSTRACT

Methods and apparatuses are provided that allow for efficient analysis of a graph describing tests, elements of a device design and test results. In various implementations of the invention, a relationship between the elements of a device design, and test results is performed. An entropy value is determined for each corresponding element based upon the test results. The entropy value may assist test engineers in identifying the elements of the device design needing redesign.

18 Claims, 5 Drawing Sheets

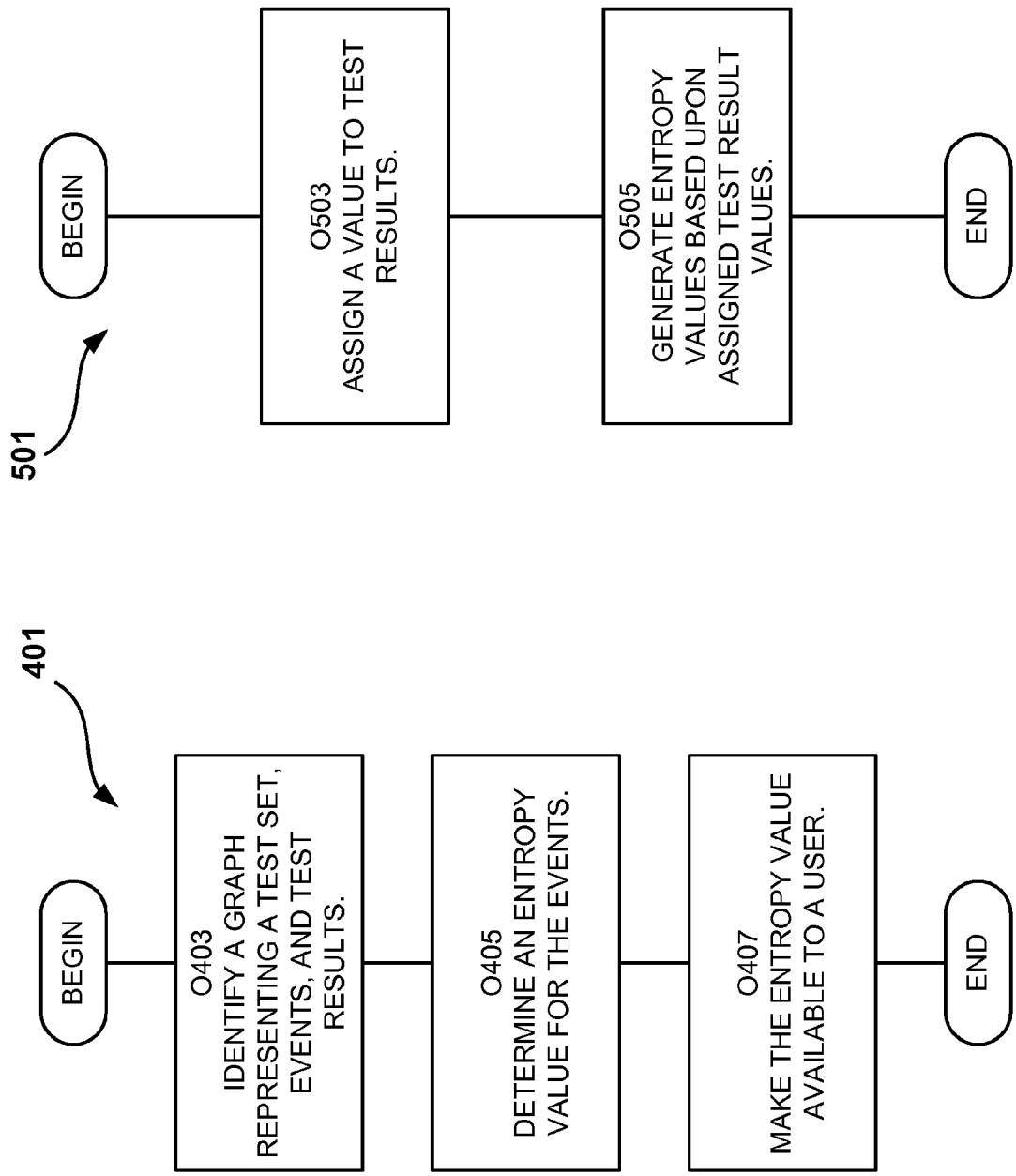

US 8,099,698 B2

VERIFICATION TEST FAILURE ANALYSIS

FIELD OF THE INVENTION

The invention relates to the field of electronic design. More particularly, various implementations of the invention relate to analyzing design verification test results. Specifically, various implementations relate to determining selected areas of a design contributing to test failures.

BACKGROUND OF THE INVENTION

Electronic circuits, such as integrated microcircuits, are used in a variety of products, from automobiles to microwaves to personal computers. Designing and fabricating microcircuit devices typically involves many steps, sometimes referred to as the "design flow." The particular steps of a design flow often are dependent upon the type of microcircuit, its complexity, the design team, and the microcircuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design. These various microcircuits are often referred to as integrated circuits (IC's).

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, to confirm that the circuit described by the device design will correctly perform the desired functions. This analysis is sometimes referred to as "system level verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing circuit device components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

As indicated, device verification often takes place prior to the actual manufacturing of the device. Accordingly, as stated, hardware description languages are employed to model the hardware and act as an embodiment for testing purposes. However, testing and verification of physical devices also occurs after manufacturing. As a result, distinguishing between verification at the design level and at the physical level is not always made in the balance of this disclosure. Furthermore, device is used interchangeably to refer to a physical embodiment of the device and the models or design of the device.

During the verification stages of device development designers subject the device to numerous tests. Some tests are generated randomly with the assistance of various test engines. While other tests are created by designers to specifically test or "exercise" select portion of the device. Ideally, enough tests are used such that all portions of a device are tested. A portion or portions of a device design exercised by a select test are often said to be "covered" by that test. Electronic design automation tools may assist in generating and carrying out tests upon a device. For example, ModelSim or Questa, both available from Mentor Graphic Corporation of Wilsonville, Oreg., may be employed to assist in performing this type of verification. Additionally, electronic design automation tools may be employed to assist in monitoring which areas of the device are covered by selected tests.

Due to the complex and interconnected nature of modern electronic device, such as integrated circuits, a small revision in one area of the design may affect the functionality of another area of the design. As a result, even small revisions of a design often require retesting of the entire design. This process can be extremely complicated. For example, a modern integrated circuit may have over 100 million gates. Running tests that would exercise each of these 100 million gates is often accomplished by executing the tests upon many computers networked in parallel. However, even with thousands of computers processing concurrently, it will take days to complete enough tests that exercise each of the 100 million gates.

This process of retesting a device after some change has been made is often referred to as regression testing. Ideally a regression test includes just enough tests that exercise each portion of the design. Often times this requires that modern designs be subject to a set of 10,000 or more tests. This set of tests typically is executed each time a small design change is made. After each set of tests is executed, any test failures must be analyzed and the design revised and retested accordingly.

As indicated above, this process can be quite time consuming and burdensome. Adding to the complexity is determining which areas of the design contributed to specific test failures. During the early stages of device design hundreds of the tests may result in a failure. Accordingly, it is not trivial to determine which areas of the device design need to be revised. Historically, designers would assume that all areas of the design not covered by a test and all areas of a design covered by failed tests needed revising. However, many tests cover multiple areas of a device. As a result assuming all areas covered by failed tests increases the design time and ultimately the time until the product may reach the market.

SUMMARY OF THE INVENTION

Methods and apparatuses are provided that allow for efficient analysis of a graph describing tests, elements of a device design and test results. In various implementations of the invention, a relationship between the elements of a device design, and test results is performed. An entropy value is determined for each corresponding element based upon the test results. The entropy value may assist test engineers in identifying the elements of the device design needing redesign.

These and additional aspects of the invention will be further understood from the following detailed disclosure of illustrative embodiments.

BRIEF DESCRIPTION OF THE DRAWINGS

The present invention will be described by way of illustrative embodiments shown in the accompanying drawings in which like references denote similar elements, and in which:

FIG. 4 illustrates a method of analyzing design verification test results;

FIG. 5 illustrates a method of determining entropy of design verification test results.

DETAILED DESCRIPTION OF ILLUSTRATIVE IMPLEMENTATIONS

The disclosed technology includes all novel and unobvious features, aspects, and embodiments of the systems and methods described herein, both alone and in various combinations and sub-combinations thereof. The disclosed features, aspects, and embodiments can be used alone or in various novel and unobvious combinations and sub-combinations with one another.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "determine" to describe the disclosed methods. Such terms are high-level abstractions of the actual operations that are performed. The actual operations that correspond to these terms will vary depending on the particular implementation and are readily discernible by one of ordinary skill in the art.

Some of the methods described herein can be implemented by software stored on a computer readable storage medium, or executed on a computer. Additionally, some of the disclosed methods may be implemented as part of a computer implemented electronic design automation (EDA) tool. The selected methods could be executed on a single computer or a computer networked with another computer or computers. For clarity, only those aspects of the software germane to these disclosed methods are described; product details well known in the art are omitted.

Illustrative Computing Environment

Figure 1:
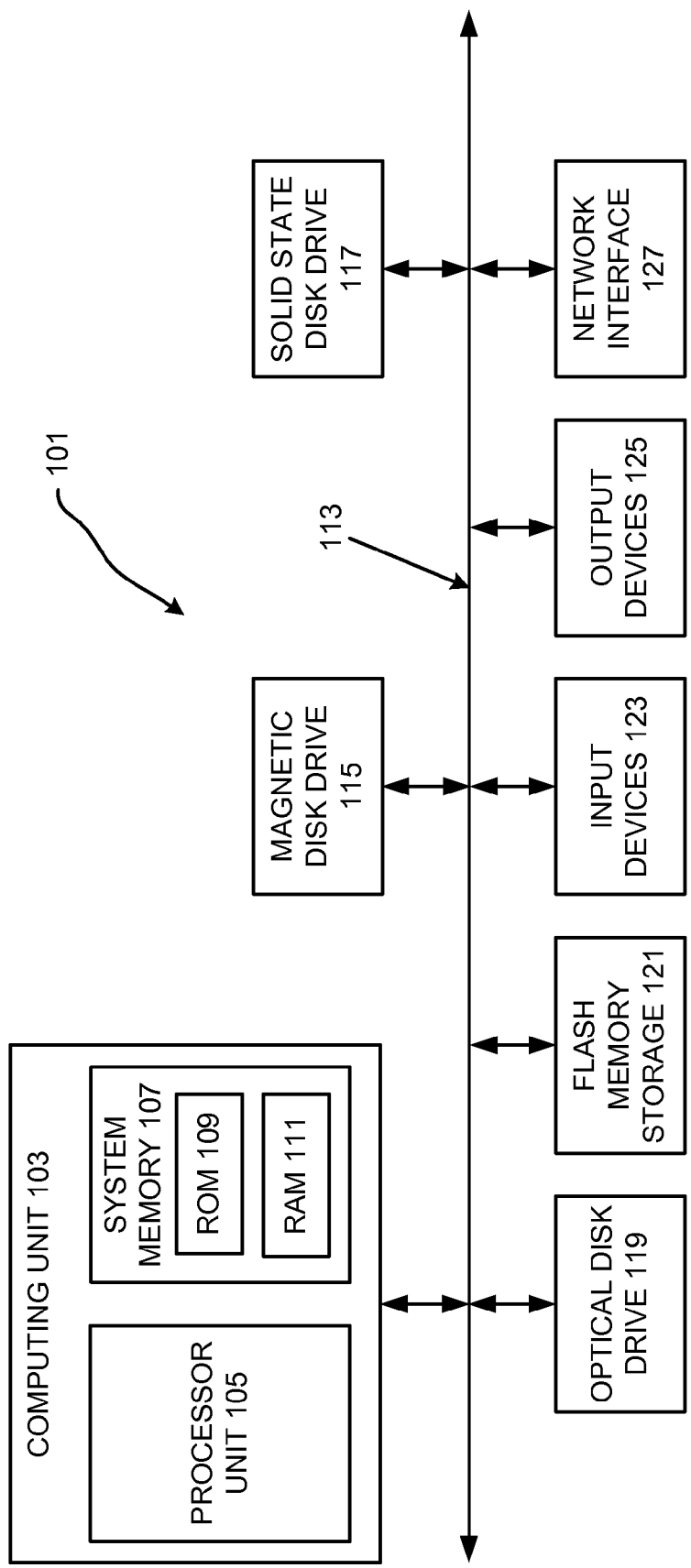
FIG. 1 illustrates an illustrative computing environment.

Various examples of the invention may be implemented through the execution of software instructions by a computing device, such as a programmable computer. Accordingly, FIG. 1 shows an illustrative example of a computing device 101. As seen in FIG. 1, the computing device 101 includes a computing unit 103. The computing unit 103 having a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a magnetic disk drives 115, a solid state disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

Figure 2:
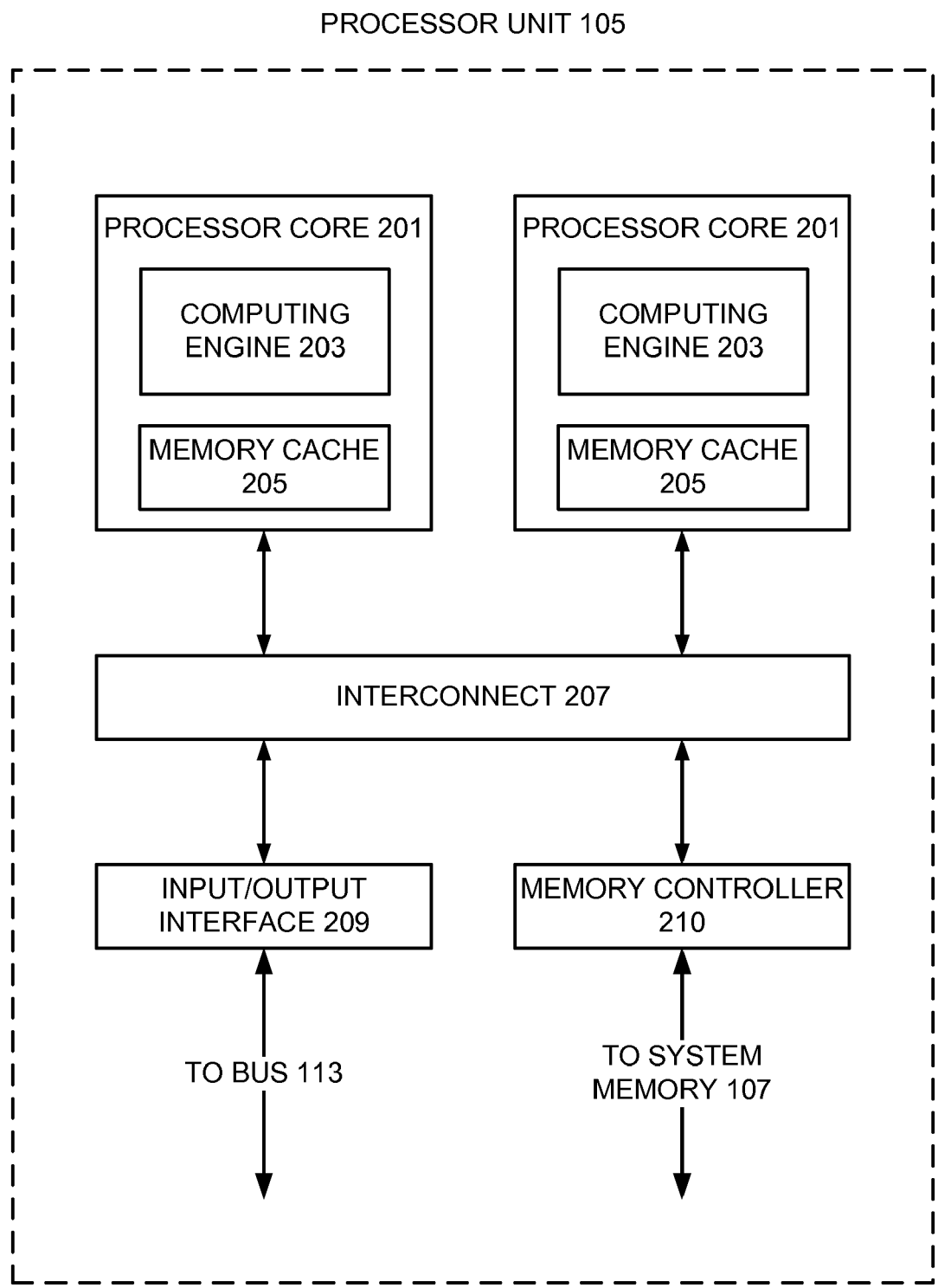
FIG. 2 illustrates a portion of the illustrative computing environment of FIG. 1, shown in further detail.

With various implementations of the invention, the processor unit 105 is a multi-core processor unit, such as the multi-core processor unit 105 illustrated in FIG. 2. As can be seen in FIG. 2, the processor unit 105 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor units 201, such as the Cell Broadband Engine™ (Cell) microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interfaces 209 and a memory controller 211. The input/output interface 209 provides a communication interface between the processor unit 201 and the bus 113. Similarly, the memory controller 211 controls the exchange of information between the processor unit 201 and the system memory 107. With some implementations of the invention, the processor units 201 may include additional components, such as a high-level cache memory accessible shared by the processor cores 201.

It should be appreciated that the computer 101 is illustrated in FIG. 1 and the processor unit 105 illustrated in FIG. 2 are shown as examples only. They are not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Design Verification Testing And Analysis

As stated above, electronic device verification typically includes subjecting the device to a plurality of tests. Each test covering a portion or portions of the device. Additionally, as detailed above, models are often employed as an embodiment with which to perform these tests. These models can take various forms, such as for example a design implemented in SystemVerilog. The set of tests are carried out with the device and the results of the tests recorded or monitored accordingly. Subsequently, the results are used to ensure the device behaves as the designer intended. Any failed tests are addressed accordingly, typically by design modification.

Figure 3:
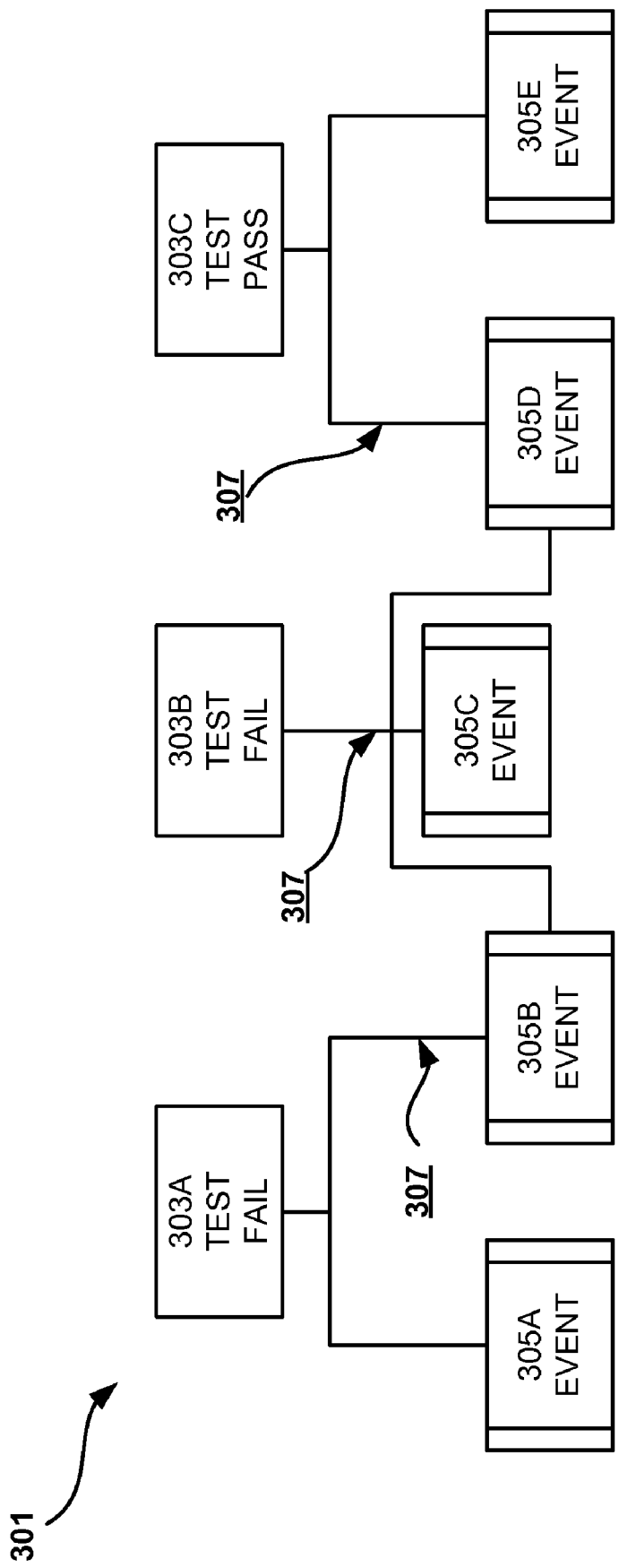
FIG. 3 illustrates a design verification test graph.

FIG. 3 illustrates a graph 301. As can be seen from FIG. 3, the graph 301 represents a test set 303, which includes a test 303A, a test 303B, and a test 303C. Additionally, as can be seen, the graph 301 includes the events 305. In various implementations of the invention, the events 305 represent the available states within the device. Accordingly, an event, such as the event 305A represents an available state within the device. With various implementations of the invention, the events 305 represent the various functions of the device. Still, with various implementations of the invention, the events 305 represent discreet portions of the device design, such as a specific line of code within the hardware description file. Alternatively, in various implementations of the invention, the events 305 represent the execution of a specific line of code within the hardware description file. With further implementations of the invention, the events 305 may represent combined functions, states or device design portions.

The graph 301 further illustrates the events covered by each test within the test set 303. More particularly, coverage lines 307 show that the test 303A covers the event 305A and the event 305B, while the test 303B covers the events 305B, 305C, and 305D. The relationship illustrated by the coverage lines 307 is often referred to as the coverage relationship. A graph such as FIG. 3 may further illustrate the test results. For example, the test 303A and 303C are denoted as having passed, while the test 303B is denoted as having failed.

In various implementations of the invention, the test set, the events, the coverage relationship, and the test results are represented by a graph, as illustrated in FIG. 3. With various implementations of the invention, the test set, the events, the coverage relationship, and the test results are illustrated in a tabular format. For example Table 1 below illustrates the test set 303 and the events 305 shown in FIG. 3.

TABLE 1

|  | TEST 303A | TEST 303B | TEST 303C |
|---|---|---|---|
| EVENT 305A | PASS |  |  |
| EVENT 305B | PASS | FAIL |  |
| EVENT 305C |  | FAIL |  |
| EVENT 305D |  | FAIL | PASS |
| EVENT 305E |  |  | PASS |

As can be seen from Table 1, in addition to displaying the test set 303 and the events 305, the coverage relationship as well as the test results are also displayed. Still, with various implementations of the invention, the test set, the events, the coverage relationship and the test results are represented in a textual format. For example, by listing them respectively in a text file.

FIG. 4 illustrates a method 401 that may be implemented according to various embodiments of the present invention. The method 401 includes an operation 403 for identifying a graph representing a test set, events, and test results. The graph may, as stated above, be in the form illustrated in FIG. 3. Alternatively, in various implementations, the graph is in the form illustrated in Table 1. The method 401 further includes an operation 405 for determining an entropy value for the events, and an operation 407 for making the entropy value available to a user. In various implementations of the invention, the operation 407 displays the entropy values on a display device, such as a liquid crystal display device connected to a general purpose computer. With various implementations of the invention, the operation 407 prints the entropy values to a printer. Still, with various implementations of the invention, the operation 407 saves the entropy values to a memory storage location.

As stated above, the operation 405 determines entropy values for the events. For example, if the method 401 was implemented with the graph 301, the operation 405 would determine entropy values for the events 305. In various implementations of the invention, an entropy value is determined for all events represented by the graph. With various implementations of the invention, an entropy value is determined for selected events represented by the graph.

Still, with various implementations of the invention, the operation 405 determines the entropy values according to the method 501 illustrated in FIG. 5. As can be seen in FIG. 5, the method 501 includes an operation 503 for assigning a value to the test result. In various implementations of the invention, test results are represented in a binary fashion. For example, a successful test result may be assigned a logic "0" value, while an unsuccessful test result may be assigned a logic "1" value. With various other implementations of the invention, the test results may already have an associated value, and the assigned value may correspond to the associated value. Still, with various implementations of the invention, a successful test result may be assigned a logic "1" value, while an unsuccessful test result may be assigned a logic "0" value.

The method 501 further includes an operation 505 for generating an entropy value for the events, based upon the assigned test result values. In various implementations of the invention, the entropy value for a given event is the sum of the test result values for the test results related to the given event by the coverage relationship. With various other implementations of the invention the entropy value for a given event is the average of the test result values for the test results related to the given event by the coverage relationship. Still, with various other implementations of the invention, the entropy value for a given event is the maximum of the test result values for the test results related to the given event by the coverage relationship.

With still further implementations of the invention, the entropy values are determined by the following equation, $$E[n] = -\sum_{n_{R1}}\sum_{n_{R2}} p(n_{r1}, n_{r2})\log_2[p(n_{r1}, n_{r2})].$$

Where E[n] equals the entropy for a given event n and p(n) equals the probability of a given event n having a test result value r.

As can be seen from the above disclosed equation, in various implementations of the invention, the entropy for a given event n is equal to above disclosed sum. Additionally, as can be seen, the equation sums the products of the probability of the event having each of the assigned values r and the base 2 logarithm of the probability of the event having each of the assigned values r. For example, the graph 301 illustrates the events 305A through 305E. Table 2 below illustrates the entropy values for the events 305A through 305E determined according to various implementations of the present invention.

TABLE 2

| EVENT | ENTROPY |
|-------|---------|
| 305A  | 0       |
| 305B  | .5      |
| 305C  | 1       |
| 305D  | .5      |
| 305E  | 0       |

Returning again to FIG. 4, in various implementations of the invention, the operation 407 in addition to making the entropy values available to a user indicates an event or events likely contributing to the unsuccessful tests. More particularly, as indicated by Table 2, the entropy of the events 305A and 305E is zero, the entropy of the events 305B and 305D is 0.5, and the entropy of the event 305C is equal to one. Accordingly, the operation 407 may highlight or suggest that the event 305C is the likely cause of the test 303B performing unsuccessfully. With still further implementations of the invention, the operation 407 sorts the entropy values from largest to smallest, and makes the sorted list of entropies available to the user.

Figure 6:
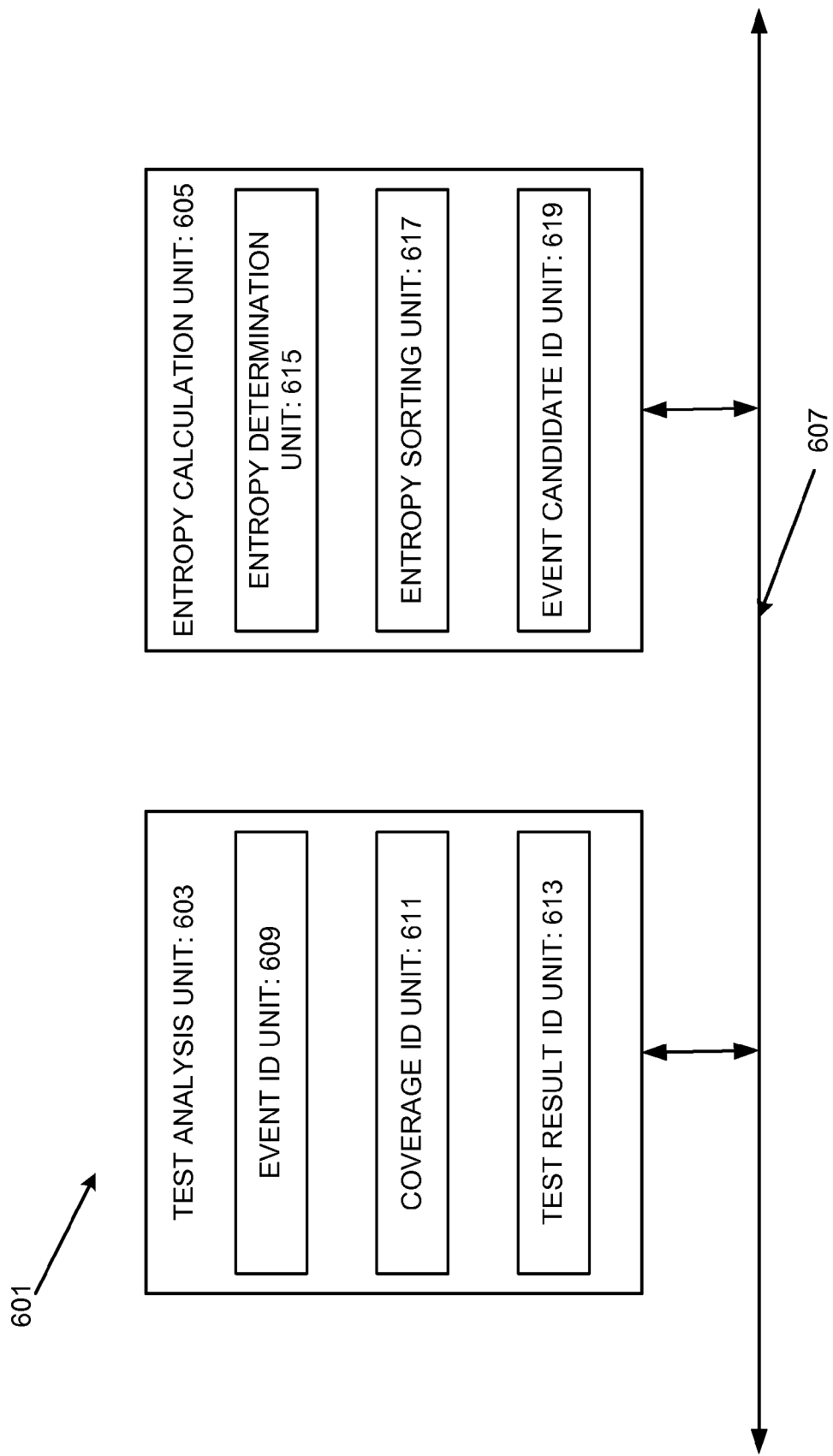
FIG. 6 illustrates an electronic design automation tool that may be implemented according to various embodiments of the present invention.

As stated above, various implementations of the invention may be included in an electronic design automation tool. FIG. 6 illustrates an electronic design automation tool that may be implemented according to various embodiments of the present invention. As can be seen from FIG. 6, the tool 601 includes a test analysis unit 603 and an entropy calculation unit 605. The test analysis unit and the entropy calculation unit 605 are connected by a bus 607. The bus 607 provides for the exchange of data between the unit 603, the unit 605, other electronic design automation tools, the host computing environment, or another computing device or tool. The test analysis unit 603 includes an event identification unit 609, a coverage identification unit 611 and a test result identification unit 613. In various implementations of the invention, the unit 603 may perform the operation 403 shown in FIG. 4.

The unit 605 includes an entropy determination unit 615, an entropy sorting unit 617, and an event candidate identification unit 619. With various implementations of the invention, the operation 405 illustrated in FIG. 4, may be performed by for example the entropy determination unit 615. The entropy sorting unit 617 may be employed to perform the operation 407 of FIG. 4. For example, the entropy sorting unit 617 may sort the entropy values from smallest to largest and save the sorting to a memory storage location. Alternatively, the sorting may be displayed to a user of the tool 601 in a display device.

The event candidate identification unit 619 may be employed to highlight events where additional debugging will likely resolve the failed test results. For example, returning to Table 2. The event 305C has the highest entropy value, indicating that the event 305C is the likeliest candidate for further debugging. More particularly, a user of the tool 601 may employ the sorted list and the event candidate identification unit 619 to narrow the areas of a design where future debugging efforts or techniques should be focuses such that test result failures may be resolved.

CONCLUSION

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

Methods and apparatuses are provided that allow for efficient analysis of a graph describing tests, elements of a device design and test results. In various implementations of the invention, a relationship between the elements of a device design, and test results is performed. An entropy value is determined for each corresponding element based upon the test results. The entropy value may assist test engineers in identifying the elements of the device design needing redesign.

What is claimed is:

1. A computer program product comprising:
   software instructions for enabling a computer to perform a set of predetermined operations; and
   a computer readable storage device bearing the software instructions;
   the set of predetermined operations including:
      identifying a verification process performed on an electronic design, wherein the verification process comprises a plurality of tests and a plurality of test results;
      identifying a graph, the graph describing a plurality of events, the plurality of tests, and the plurality of test results, wherein at least one of the plurality of test results indicates a failure in the electronic design;
      determining an entropy value for ones of the plurality of events, the entropy values based in part upon the plurality of test results;

identifying one or more events that based upon the entropy values contribute to the failure in the electronic design;

making the identified one or more events available to a user; and making the entropy values available to the user.

2. The product recited in claim 1, the predetermined operation of determining the entropy values comprising:

generating index values for ones of the plurality of events; and determining an entropy value for a select event by summing the index values for the select event.

3. The product recited in claim 2, generating index values for ones of the plurality of events comprises:

determining a probability that ones of the events have a given test result; and computing the product of the probability and a logarithm of the probability.

4. The product recited in claim 3, wherein the logarithm is the base 2 logarithm.

5. The product recited in claim 4, wherein the plurality of events are available states within an electronic device design.

6. The product recited in claim 4, wherein the plurality of events are functional descriptions within an electronic device design.

7. A computer system comprising:

a processor, and a memory including instruction executable by the processor that cause the computer system to perform the operations of:

identifying a verification process performed on an electronic design, wherein the verification process comprises a plurality of tests and a plurality of test results;

identifying a graph, the graph describing a plurality of events, the plurality of tests, and the plurality of test results, wherein at least one of the plurality of test results indicates a failure in the electronic design;

determining an entropy value for ones of the plurality of events, the entropy values based in part upon the plurality of test results;

identifying one or more events that based upon the entropy values contribute to the failure in the electronic design;

making the identified one or more events available to a user; and making the entropy values available to the user.

8. The system recited in claim 7, the operation of determining the entropy values comprising:

generating index values for ones of the plurality of events; and determining an entropy value for a select event by summing the index values for the select event.

9. The system recited in claim 8, generating index values for ones of the plurality of events comprises:

determining a probability that ones of the events have a given test result; and computing the product of the probability and a logarithm of the probability.

10. The system recited in claim 9, wherein the logarithm is the base 2 logarithm.

11. The system recited in claim 10, wherein the plurality of events are available states within an electronic device design.

12. The system recited in claim 10, wherein the plurality of events are functional descriptions within an electronic device design.

13. A computer implemented method comprising:

causing a processor to execute software instructions that perform a set of functions, the set of functions including;

identifying a verification process performed on an electronic design, wherein the verification process comprises a plurality of tests and a plurality of test results;

identifying a graph, the graph describing a plurality of events, the plurality of tests, and the plurality of test results, wherein at least one of the plurality of test results indicates a failure in the electronic design;

determining an entropy value for ones of the plurality of events, the entropy values based in part upon the plurality of test results;

identifying one or more events that based upon the entropy values contribute to the failure in the electronic design;

making the identified one or more vents available to a user; and making the entropy values available to the user.

14. The computer implemented method recited in claim 13, the act of determining the entropy values comprising:

generating index values for ones of the plurality of events; and determining an entropy value for a select event by summing the index values for the select event.

15. The computer implemented method recited in claim 14, generating index values for ones of the plurality of events comprises:

determining a probability that ones of the events have a given test result; and computing the product of the probability and a logarithm of the probability.

16. The computer implemented method recited in claim 15, wherein the logarithm is the base 2 logarithm.

17. The computer implemented method recited in claim 16, wherein the plurality of events are available states within an electronic device design.

18. The computer implemented method recited in claim 16, wherein the plurality of events are functional descriptions within an electronic device design.

\* \* \* \* \*